(12) United States Patent
Wecker

(10) Patent No.: US 9,064,067 B2
(45) Date of Patent: Jun. 23, 2015

(54) QUANTUM GATE OPTIMIZATIONS

(75) Inventor: David B. Wecker, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 13/567,330

(22) Filed: Aug. 6, 2012

(65) Prior Publication Data

US 2014/0040849 A1     Feb. 6, 2014

(51) Int. Cl.
*G06F 17/50*     (2006.01)
*G06F 9/455*     (2006.01)

(52) U.S. Cl.
CPC ........ *G06F 17/5022* (2013.01); *G06F 17/5045* (2013.01); *G06F 17/5077* (2013.01); *G06F 17/5036* (2013.01); *G06F 17/5068* (2013.01)

(58) Field of Classification Search
CPC ............ G06F 17/5045; G06F 17/5036; G06F 17/505; G06F 17/5068; G06F 17/5054; G06F 17/504; G06F 17/5022; G06F 17/5081; G06F 17/5077
USPC .......................................... 716/100, 107, 132
See application file for complete search history.

(56) References Cited

U.S. PATENT DOCUMENTS

| | | | |
|---|---|---|---|
| 6,578,018 B1 | 6/2003 | Ulyanov | |
| 7,376,547 B2 | 5/2008 | Meredith | |
| 2003/0164490 A1* | 9/2003 | Blais | ............................ 257/14 |
| 2006/0123363 A1* | 6/2006 | Williams et al. ................. | 716/1 |
| 2006/0224547 A1 | 10/2006 | Ulyanov et al. | |
| 2007/0266347 A1* | 11/2007 | Chang et al. ...................... | 716/3 |
| 2008/0313114 A1* | 12/2008 | Rose ............................... | 706/13 |
| 2009/0014714 A1* | 1/2009 | Koch .............................. | 257/31 |
| 2010/0251049 A1* | 9/2010 | Goto et al. .................... | 714/746 |
| 2011/0022820 A1* | 1/2011 | Bunyk et al. ...................... | 712/1 |
| 2011/0031994 A1* | 2/2011 | Berkley ............................ | 326/3 |
| 2011/0054876 A1* | 3/2011 | Biamonte et al. ............... | 703/15 |
| 2011/0138344 A1* | 6/2011 | Ahn .............................. | 716/104 |

OTHER PUBLICATIONS

Chang, S-C, et al. "Synthesis for multiple input wires repacement of a gate for wiring consideration", 1999 IEEE?ACM International Conference on Computer—aided Design, 1999, pp. 115-118.*
Beroni, A, et al. "Numerical Simulation of Quantum Logic Gates Based on Quantum Wires", 7th International Workshop on Computational Electonics, 2000, pp. 41-42.*
Morrison, M, et al. "A Novel Optimization Method for Reversanble Logic Circuit Minimization" 2013 IEEE Computer Society Annual Symposium on VLSI, pp. 182-187.*

(Continued)

*Primary Examiner* — Stacy Whitmore
*Assistant Examiner* — Magid Dimyan
(74) *Attorney, Agent, or Firm* — Steve Wight; Judy Yee; Micky Minhas

(57) ABSTRACT

Disclosed are systems and methods for improving quantum computation simulation execution time by "growing" sets of small quantum gates into larger ones. Two approaches are described. In the first approach, sub-strings may be replaced by a single representative that may be used multiple times throughout the quantum circuit. In the second approach, nearby gates may be coalesced in an iterative fashion, to thereby build larger and larger gates. Results may be cached for re-use. Both of these approaches have proven effective and have gained typical simulation speed-ups of 1-2 orders of magnitude.

19 Claims, 8 Drawing Sheets

(56) References Cited

OTHER PUBLICATIONS

Daskin, et al., "Decomposition of unitary matrices for finding quantum circuits: Application to molecular Hamiltonians", Retrieved at <<http://www.chem.purdue.edu/kais/paper/Anmer-JCP-2011.pdf>>, Proceedings of Journal of Chemical Physics, vol. 134, Issue 14, Apr. 14, 2011, pp. 10.

Vartiainen, et al., "Efficient Decomposition of Quantum Gates", Retrieved at <<http://arxiv.org/pdf/quant-ph/0312218.pdf>>, Proceedings of Phys. Rev. Lett. 92, 177902, Apr. 15, 2004, pp. 1-4.

Kassala, et al., "Polynomial-Time Quantum Algorithm for the Simulation of Chemical Dynamics", Retrieved at <<http://dash.harvard.edu/bitstream/handle/1/4646015/aspuru_polytime.pdf?sequence=1>>, Proceedings of the National Academy of Sciences, U S A., 105(48): 18681-18686, Dec. 2, 2004, pp. 10.

Chakrabarti, et al., "Design of a Hardware Description Language Based Quantum Circuit Simulator", Retrieved at <<http://ijrte.academypublisher.com/vol01/no03/ijrte0103248252.pdf>>, Proceedings of International Journal of Recent Trends in Engineering, vol. 1, No. 3, Dec. 4, 2009, pp. 248-252.

* cited by examiner

QUANTUM GATE OPTIMIZATIONS

BACKGROUND

Simulation of quantum computations on classical computers is desirable. However, such simulations are known to be inefficient processes in terms of both storage space required and time required to perform the simulated computations (execution time).

A quantum computation may be viewed as a serial application of repeated matrix-vector multiplies of an operator (or gate) (u) and a state column vector (or ket) ($|\Psi\rangle$) to thereby generate a new state column vector. This may be expressed as: $|\Psi_{new}\rangle = U_n \times U_{n-1} \times \ldots \times U_1 |\Psi_{old}\rangle$. A difficulty in simulating such a computation is that for each qubit, the state vector and the operator double in size. A qubit may be defined as a unit of quantum computation, and may be viewed as the functional equivalent of a "bit" in classical computation. In a quantum system with 30 qubits, for example, the state vector has one billion entries and each operator is one billion by one billion in size ($2^{30} \times 2^{30}$). This quickly becomes a problem in both storage size and the amount of time it takes to perform an operation.

Known approaches to improving efficiency in classical simulation of quantum computations have focused on brute force solutions. It would be desirable to employ algorithmic optimizations to increase efficiencies in both dimensions by multiple orders of magnitude, thereby allowing simulations of large quantum systems on classical computer hardware that have not been possible previously.

SUMMARY

Disclosed herein are systems and methods for improving quantum computation simulation execution time by "growing" sets of small quantum gates into larger ones. Two approaches are described. The first approach may be characterized as viewing the problem (i.e., the desire to increase computational efficiency) from the top down. The second approach may be characterized as viewing the problem from the bottom up.

In the first approach, a sequence of operations may be viewed as a "genome," where common sub-expressions may be matched and replaced via a variant on the well-known BLAST algorithm that is used in computational biology. This allows the largest common sub-strings to be replaced by a single representative that may be used multiple times throughout the quantum circuit. In the second approach, nearby gates may be coalesced in an iterative fashion, to thereby build larger and larger gates. Results may be cached for re-use. Both of these approaches have proven effective and have gained typical simulation speed-ups of 1-2 orders of magnitude.

DETAILED DESCRIPTION OF THE ILLUSTRATIVE EMBODIMENTS

Example Computing Environment

Figure 1:
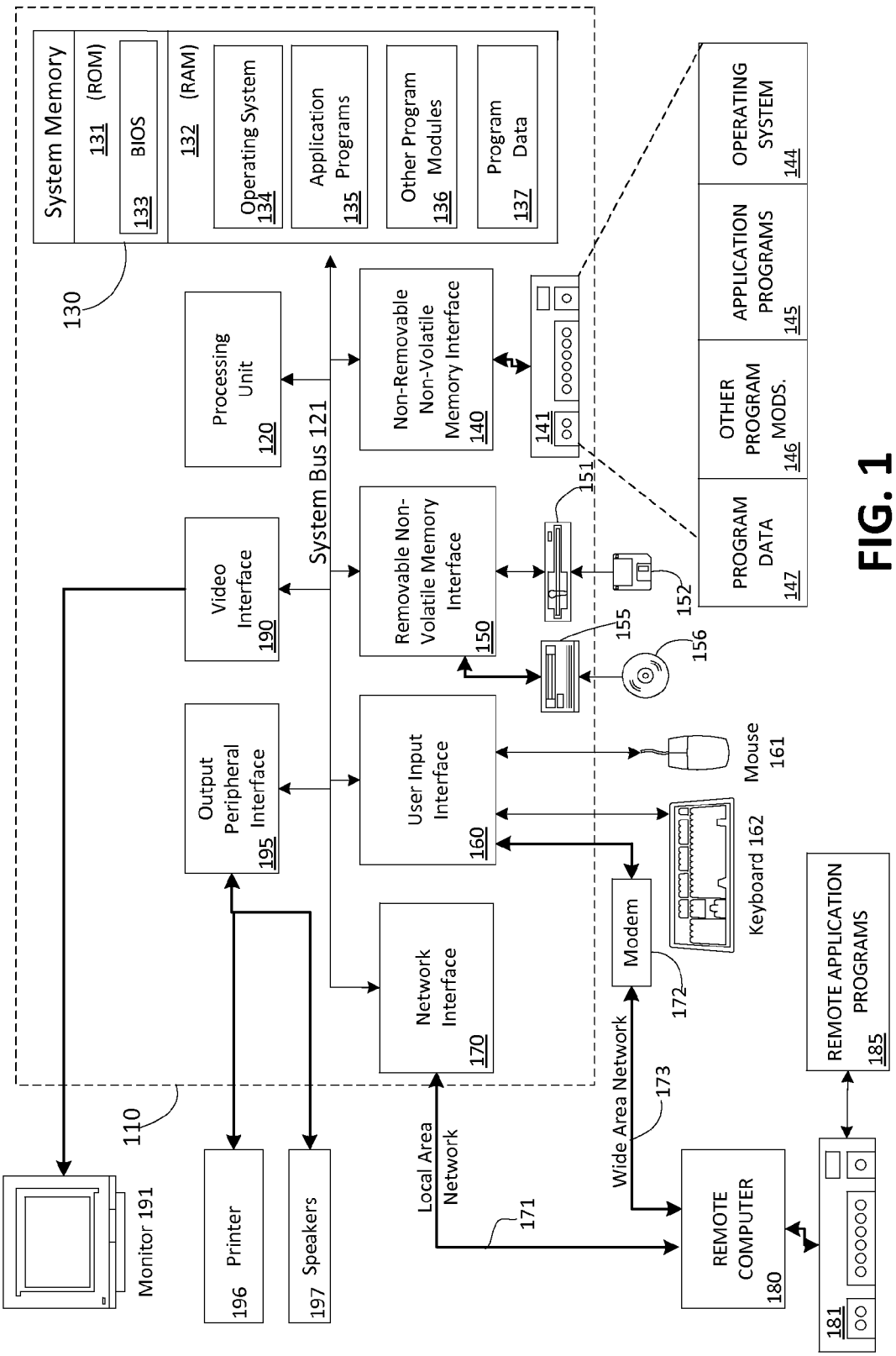
FIG. 1 is a block diagram showing an example classical computing environment.

FIG. 1 shows an example computing environment in which example embodiments and aspects may be implemented. The computing system environment 100 is only one example of a suitable computing environment and is not intended to suggest any limitation as to the scope of use or functionality. Neither should the computing environment 100 be interpreted as having any dependency or requirement relating to any one or combination of components illustrated in the example operating environment 100.

Numerous other general purpose or special purpose computing system environments or configurations may be used. Examples of well-known computing systems, environments, and/or configurations that may be suitable for use include, but are not limited to, personal computers, server computers, hand-held or laptop devices, multiprocessor systems, microprocessor-based systems, set top boxes, programmable consumer electronics, network PCs, minicomputers, mainframe computers, embedded systems, distributed computing environments that include any of the above systems or devices, and the like.

Computer-executable instructions, such as program modules, being executed by a computer may be used. Generally, program modules include routines, programs, objects, components, data structures, etc. that perform particular tasks or implement particular abstract data types. Distributed computing environments may be used where tasks are performed by remote processing devices that are linked through a communications network or other data transmission medium. In a distributed computing environment, program modules and other data may be located in both local and remote computer storage media including memory storage devices.

With reference to FIG. 1, an example system includes a general purpose computing device in the form of a computer 110. Components of computer 110 may include, but are not limited to, a processing unit 120, a system memory 130, and a system bus 121 that couples various system components including the system memory to the processing unit 120. The processing unit 120 may represent multiple logical processing units such as those supported on a multi-threaded processor. The system bus 121 may be any of several types of bus structures including a memory bus or memory controller, a peripheral bus, and a local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus). The system bus 121 may also be implemented as a point-to-point connection, switching fabric, or the like, among the communicating devices.

Computer 110 typically includes a variety of computer readable media. Computer readable media can be any available media that can be accessed by computer 110 and includes both volatile and nonvolatile media, removable and non-removable media. By way of example, and not limitation, computer readable media may comprise computer storage media and communication media. Computer storage media includes both volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can accessed by computer 110. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer readable media.

The system memory 130 includes computer storage media in the form of volatile and/or nonvolatile memory such as read only memory (ROM) 131 and random access memory (RAM) 132. A basic input/output system 133 (BIOS), containing the basic routines that help to transfer information between elements within computer 110, such as during start-up, is typically stored in ROM 131. RAM 132 typically contains data and/or program modules that are immediately accessible to and/or presently being operated on by processing unit 120. By way of example, and not limitation, FIG. 1 illustrates operating system 134, application programs 135, other program modules 136, and program data 137.

The computer 110 may also include other removable/non-removable, volatile/nonvolatile computer storage media. By way of example only, FIG. 1 illustrates a hard disk drive 140 that reads from or writes to non-removable, nonvolatile magnetic media, a magnetic disk drive 151 that reads from or writes to a removable, nonvolatile magnetic disk 152, and an optical disk drive 155 that reads from or writes to a removable, nonvolatile optical disk 156, such as a CD ROM or other optical media. Other removable/non-removable, volatile/nonvolatile computer storage media that can be used in the example operating environment include, but are not limited to, magnetic tape cassettes, flash memory cards, digital versatile disks, digital video tape, solid state RAM, solid state ROM, and the like. The hard disk drive 141 is typically connected to the system bus 121 through a non-removable memory interface such as interface 140, and magnetic disk drive 151 and optical disk drive 155 are typically connected to the system bus 121 by a removable memory interface, such as interface 150.

The drives and their associated computer storage media discussed above and illustrated in FIG. 1, provide storage of computer readable instructions, data structures, program modules and other data for the computer 110. In FIG. 1, for example, hard disk drive 141 is illustrated as storing operating system 144, application programs 145, other program modules 146, and program data 147. Note that these components can either be the same as or different from operating system 134, application programs 135, other program modules 136, and program data 137. Operating system 144, application programs 145, other program modules 146, and program data 147 are given different numbers here to illustrate that, at a minimum, they are different copies. A user may enter commands and information into the computer 20 through input devices such as a keyboard 162 and pointing device 161, commonly referred to as a mouse, trackball or touch pad. Other input devices (not shown) may include a microphone, joystick, game pad, satellite dish, scanner, or the like. These and other input devices are often connected to the processing unit 120 through a user input interface 160 that is coupled to the system bus, but may be connected by other interface and bus structures, such as a parallel port, game port or a universal serial bus (USB). A monitor 191 or other type of display device is also connected to the system bus 121 via an interface, such as a video interface 190. In addition to the monitor, computers may also include other peripheral output devices such as speakers 197 and printer 196, which may be connected through an output peripheral interface 195.

The computer 110 may operate in a networked environment using logical connections to one or more remote computers, such as a remote computer 180. The remote computer 180 may be a personal computer, a server, a router, a network PC, a peer device or other common network node, and typically includes many or all of the elements described above relative to the computer 110, although only a memory storage device 181 has been illustrated in FIG. 1. The logical connections depicted in FIG. 1 include a local area network (LAN) 171 and a wide area network (WAN) 173, but may also include other networks. Such networking environments are commonplace in offices, enterprise-wide computer networks, intranets and the Internet. When used in a LAN networking environment, the computer 110 is connected to the LAN 171 through a network interface or adapter 170. When used in a WAN networking environment, the computer 110 typically includes a modem 172 or other means for establishing communications over the WAN 173, such as the Internet. The modem 172, which may be internal or external, may be connected to the system bus 121 via the user input interface 160, or other appropriate mechanism. In a networked environment, program modules depicted relative to the computer 110, or portions thereof, may be stored in the remote memory storage device. By way of example, and not limitation, FIG. 1 illustrates remote application programs 185 as residing on memory device 181. It will be appreciated that the network connections shown are example and other means of establishing a communications link between the computers may be used.

The quantum computation expression $|\Psi_{new}\rangle = U_n \times U_{n-1} \times \ldots \times U_1 |\Psi_{old}\rangle$ may be viewed as a circuit, where the operators $U_1, U_2 \ldots U_n$ are gates in the circuit, and information flows through the gates transforming one state $|\Psi_{old}\rangle$ into another $|\Psi_{new}\rangle$. For simplicity of description, the systems and methods disclosed herein will be described with reference to circuits having only unitary operations. It should be understood that, if a circuit contains non-unitary (i.e., non-reversible) operations, like measurement or classical operation, for example, the circuit can be divided such that there are strings of unitary operations, i.e., sub-circuits, to which reference is made herein.

Quantum Gate Optimizations

In typical circuits, the operator ($U_{op}$) is a fairly small matrix (on the order of 8×8), but gets expanded to the size of the state ($|\Psi\rangle$) (which is typically very large) in a way that sets up U to only change the elements of the state (qubits) that the original operator ($U_{op}$) has been defined to manipulate. Each qubit may be perceived as a wire in the circuit. Each gate may be defined by a matrix, and the wires on which the gate is to operate. A wire may also be viewed as a bit position in the address of the state vector, such that the state for k qubits is, therefore, always $2^k$ in length.

A first, top-down approach will now be described. In the first approach, a sequence of operations may be viewed as a "genome," where common sub-expressions may be matched and replaced via a variant on the well-known BLAST algorithm that is used in computational biology. This allows the largest common sub-strings to be replaced by a single representative that may be used multiple times throughout the quantum circuit.

According to the first approach, the string of gates may be viewed as an encoded strand (like DNA, for example). Here, the desire is to find sub-strings that are common (e.g., repeated) across the entire circuit. The reason for this is that the entire sub-string (operators) can be replaced by a single operator (matrix) that has been pre-multiplied. This means that every time this sub-string is encountered, much less processing is required by using the pre-multiplied version. This is a standard matching problem (e.g., BLAST) with a twist.

If the U operators are used naively, massive matrices (order $2^k$) must be multiplied and stored, straining the limits of both time and space. In addition, instead of having a small alphabet (e.g., CGAT, in the case of DNA), quantum computation may require a very large alphabet, represented by every unique matrix in the system. This makes a classic BLAST approach unusable.

By viewing the individual operators ($U_{op}$) as an "alphabet" akin to the CGAT of DNA, excellent matching may be achieved on a small set of gates (i.e., the "primitive" gates), and the size of the solution matrices may be much smaller. However, because each gate is applied, in general, to different sets of wires, and the matrix $U_{op}$ by itself is no longer representative of the function it performs (U), the wrong computational result may be obtained.

Instead, each gate may be represented as a code (e.g., a hash) that includes the gate name, the number of wires, and the order of the wires used. Now, sub-strings that are repeated throughout the circuit may be matched. However, if this is done naively, the built gate will grow towards a size of $2^k \times 2^k$ as more and more wires are involved. For this reason, it is desirable to use a technique for deciding which subsets are worth coalescing and which are not. This can be anything from a simple threshold (e.g., if more that x wires are involved, stop growing the sub-circuit) to sophisticated techniques using dynamic programming and m gate look-ahead. In the end, a cache of these sub-circuits may be built, and any time an entry appears, it may be replaced by its grown representative from the cache.

Figure 2:
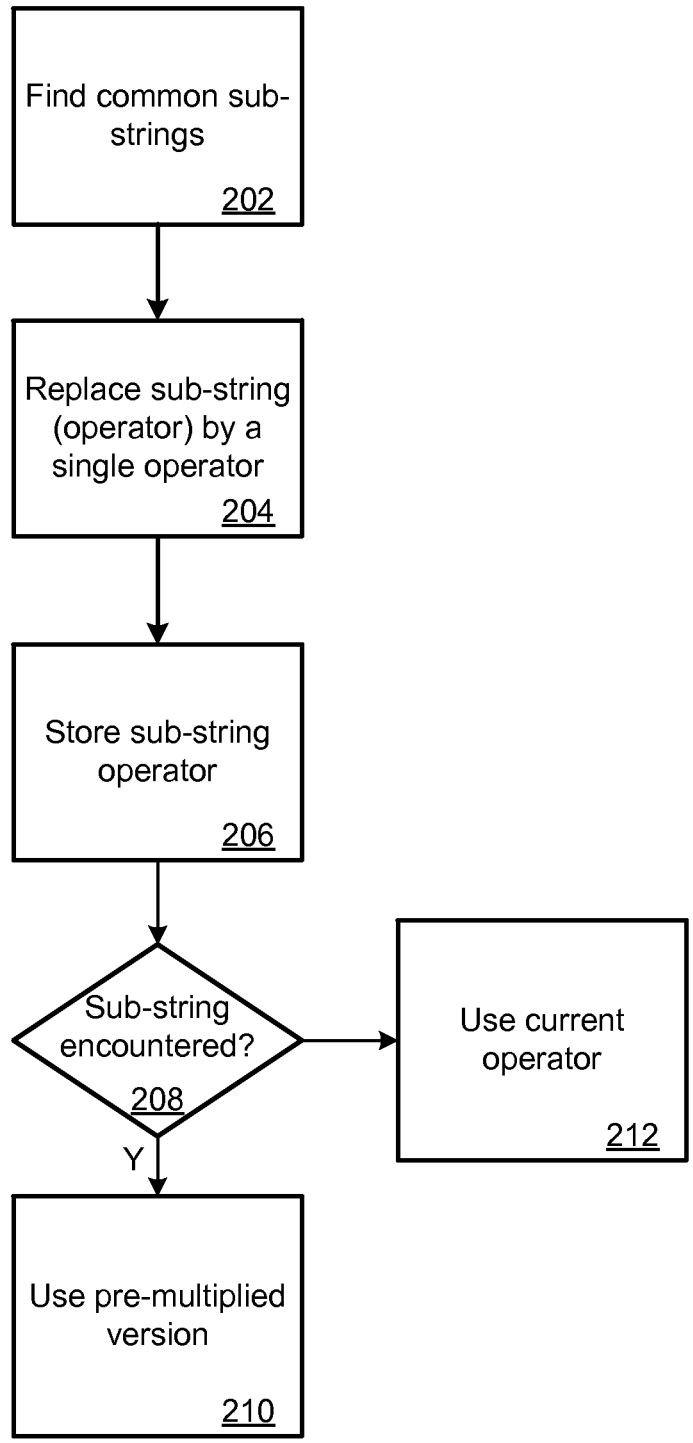
FIG. 2 is a flowchart of an example of a top-down method for quantum gate optimization.

FIG. 2 is a flowchart of an example of a top-down method 200 for quantum gate optimization. At 202, operators that are common (e.g., repeated) across the entire circuit may be found. At 204, each such common operator may be replaced by a single (pre-multiplied) operator. At 206, the replacement operator may be stored (in cache, for example).

When, at 208, any of the common operators is encountered, then the pre-multiplied operator may be applied to the current state vector to perform the operation. If the current operator, at 208, is an operator that was not found to be a common operator, then the operator may be applied normally.

According to a second, bottom-up approach, nearby gates may be coalesced in an iterative fashion, over a number of wires, to thereby build larger and larger gates. Results may be cached for re-use.

Starting with one of the wires, the circuit may be reviewed for sequences of one-wire gates on the same wire. The one-wire gates on the selected wire may be grown together into a replacement sub-circuit. The replacement sub-circuit may be stored in a cache.

The circuit may then be reviewed for gates that span two wires. Examples of gates that span two wires include two one-wire gates on different wires. The wires that the gate spans may be directly adjacent to one another, or separated by other wires that gate does not span. Again, these gates may be coalesced together as sub-circuits and placed in the cache.

This process may be repeated as many times as desired, to whatever size (n-wire) sub-circuits are desired. It should be understood that the value of n may be chosen differently for different reasons. The decision as to which gates to pull together may be made as soon as a pair is found, or via dynamic programming, or by other technique that looks at multiple alternatives at the same time and uses a cost metric to choose among them.

Figure 3:
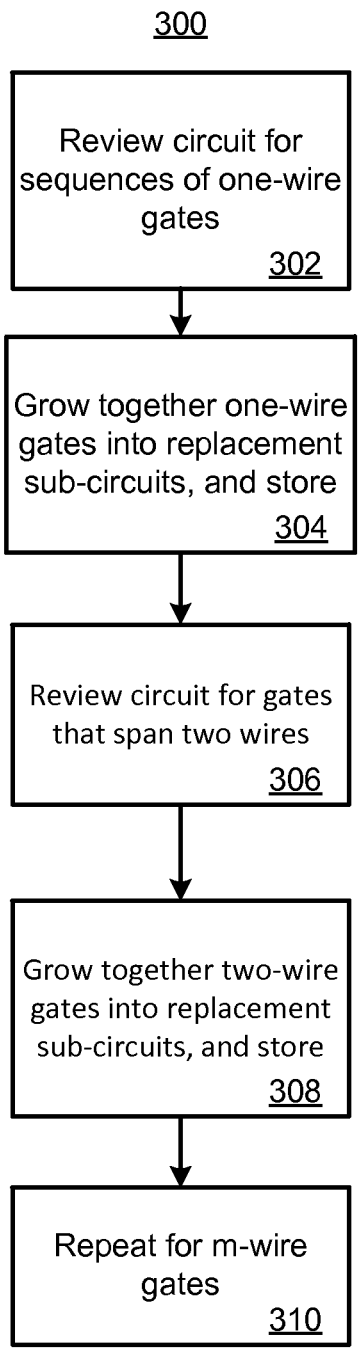
FIG. 3 is a flowchart of an example of a bottom-up method for quantum gate optimization.

FIG. 3 is a flowchart of an example of a bottom-up method 300 for quantum gate optimization. At 302, the circuit may be reviewed for sequences of one-wire gates. At 304, the one-wire gates may be grown into replacement sub-circuits, and stored (in cache, for example).

At 304, the circuit may be reviewed for sequence of two-wire gates. At 308, the two-wire gates may be grown into replacement sub-circuits, and stored (in cache, for example). The process may be repeated, at 310, to grow together up to m-wire gates, where m may be any desired value.

In both techniques, two optimizations have been found to be particularly useful. First, instead of stopping based on wire count, it may be desirable to stop growing based on the density of the resulting matrix. Many of the gates used in quantum computing tend to be very sparse. And many times, their combinations stay sparse. For this reason, very large gates may be created that take very little storage (if stored as a sparse matrix). This allows very large sub-circuits to be created (with many wires) that take very little storage and are efficient to multiply when used. By the same token, some gates are very dense and very few wires can be grouped together before the overhead becomes burdensome.

While making decisions of which sub-circuits to grow and which ones to leave alone (using density as a metric), it may be useful to randomly let a percentage of the dense matrices grow. This is because many of these dense matrices will typically be used as part of other sub-circuits (i.e., re-used) and may actually become sparser as they are combined with other sub-circuits. Typically, it may be too expensive to make an informed decision of when this will happen (lots of matrix multiplications required). However, even a small random number that become allowed make a major difference in the increased computational speed obtained with the final circuit.

Figure 4:
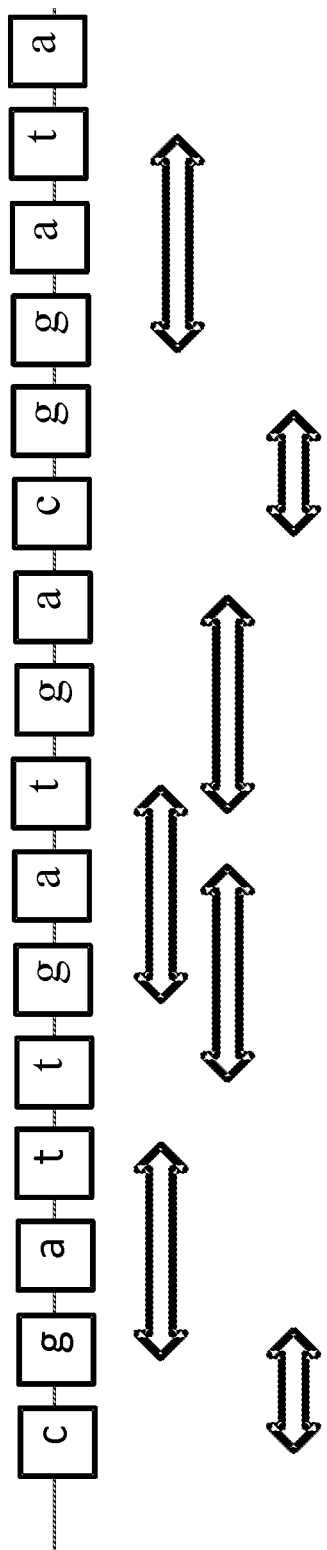
FIG. 4 provides genome alignment examples of three sequences that could be identified and aligned (identified as common sub-strings).

FIG. 4 provides genome alignment examples of three sequences that could be identified and aligned (i.e., identified as common sub-strings). The three common sub-strings depicted in FIG. 4 are CG (two repetitions), GAT (three repetitions), and TGA (two repetitions). In essence, the "strand" expressed in FIG. 4 (as a string) may be searched to identify any number of sub-expressions (sub-strings), with the objective being to identify common sub-strings that are as long as possible with as many repetitions as possible.

Figure 5:
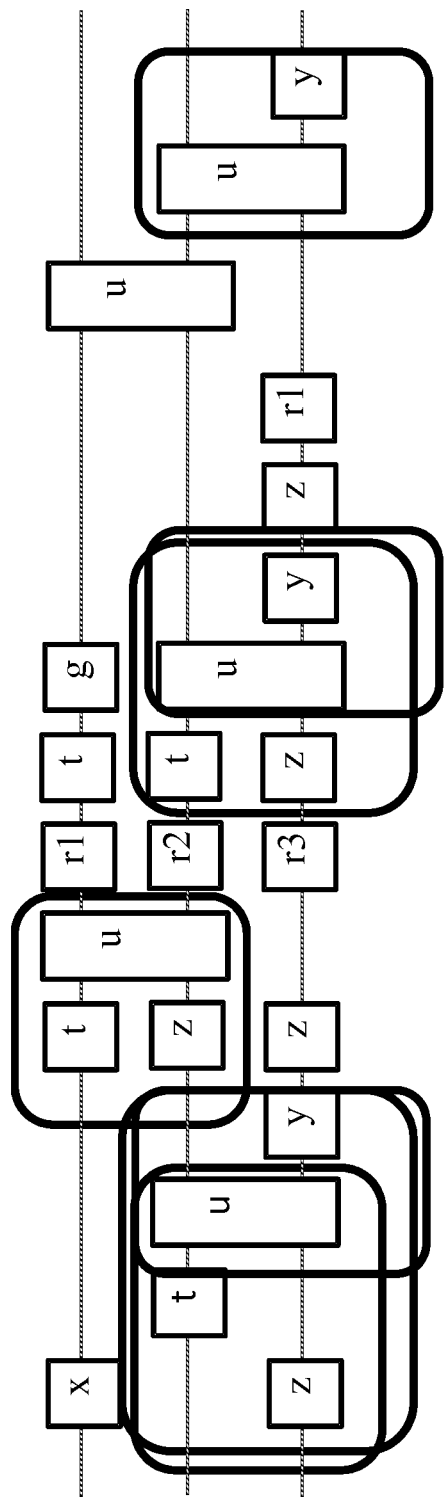
FIG. 5 depicts gate alignment showing three possible substring alignments.

FIG. 5 depicts gate alignment showing three possible sub-string alignments. This is the same idea as BLAST with additional requirements and restrictions. Here, there are multiple "strands" and the gates can span multiple wires, in any order, and as any set. Note that they need not be contiguous, though depicted as such in FIG. 5 for the sake of clarity.

Common sub-strings may be on different wires, as long as all of the internal connections are the same (relative structure). Additionally, growing sub-strings too "wide" (i.e., on too many wires) may be undesirable, as each additional wire costs twice as many rows and twice as many columns (which implies four-times as much storage worst case). Length (i.e., the number of gates) costs nothing, so it may be desirable to pull together longer strings of few wires. Many different heuristics could be used for defining "good" sub-strings to build into single Unitary matrices.

Figure 6:
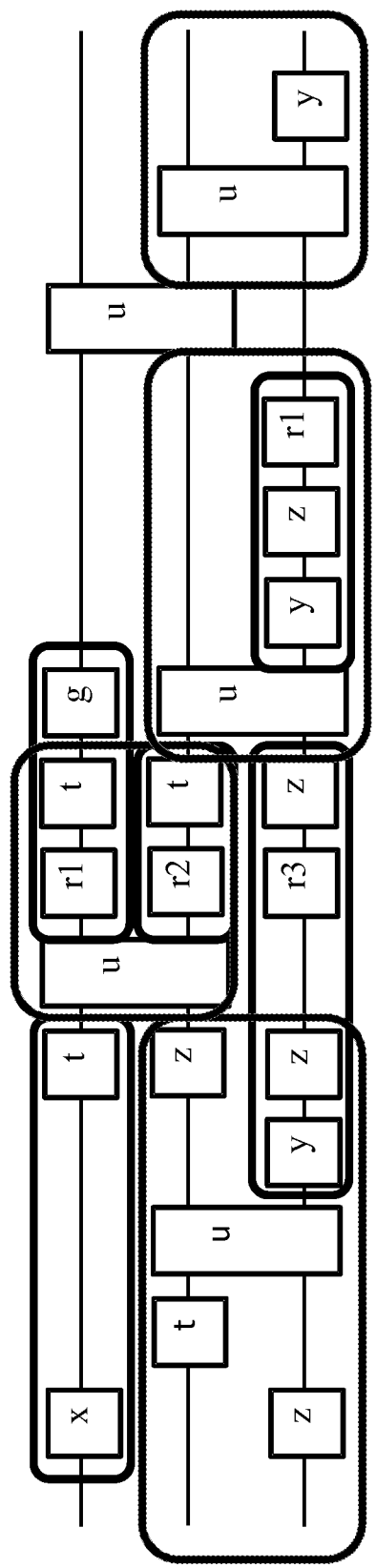
FIG. 6 depicts gate alignment using the bottom-up approach described herein.
Figure 7:
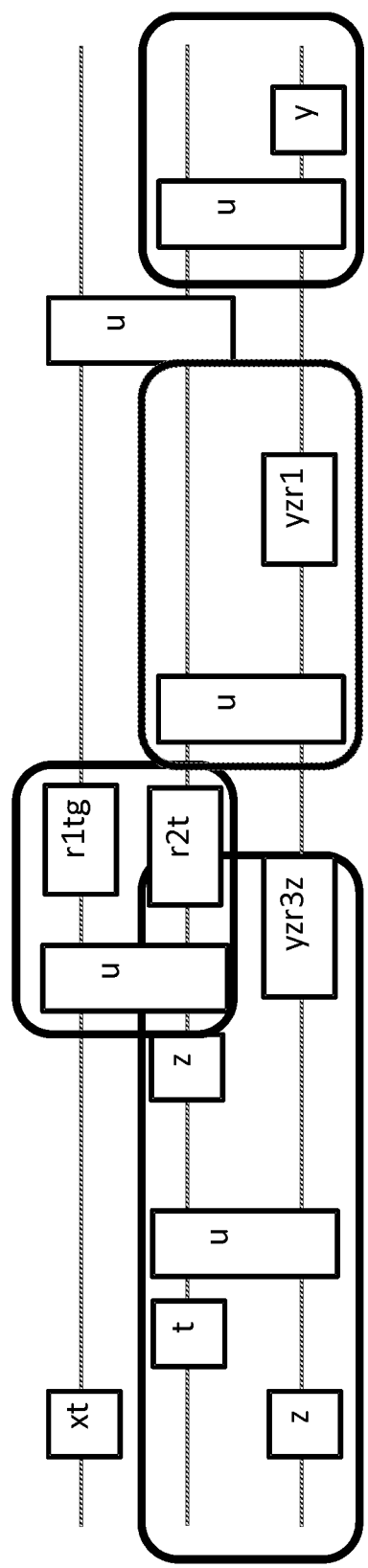
FIG. 7 depicts the result of a one-wire gather.
Figure 8:
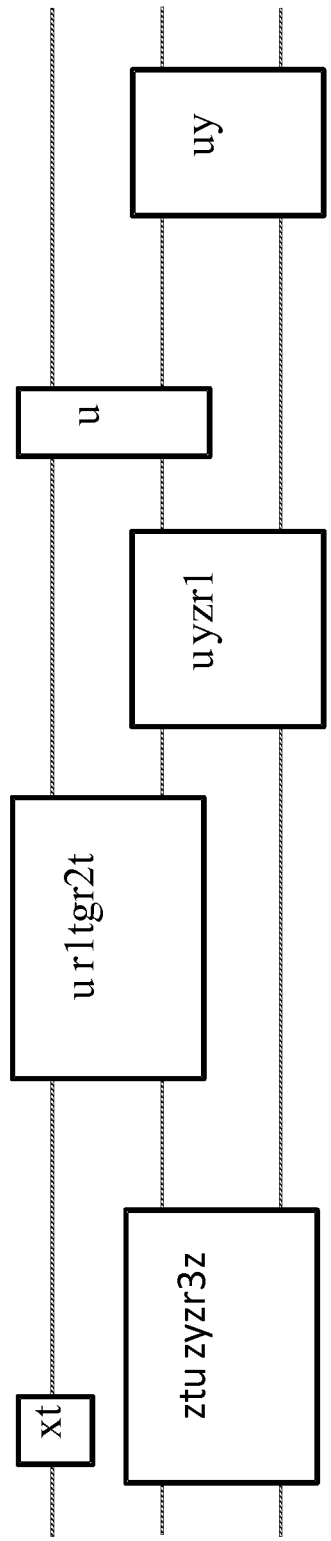
FIG. 8 depicts the result of a two-wire gather.

FIG. 6 depicts gate alignment using the bottom-up approach described above. As shown, gates on one wire can be gathered first, and then gates on two wires may be gathered. FIG. 7 depicts the result of the one-wire gather on the circuit of FIG. 6. FIG. 8 depicts the result of the subsequent two-wire gather.

In essence, the bottom up approach is a simple iterative process. For a number of wires, n, where n ranges from 1 to the maximum desired, sequences of gates that span the desired number of wires may be found. The sequences may be non-contiguous. If the sequence has been encountered before, then the previously built sub-string may be used. Otherwise, a single gate may be built to replace the substring.

If the gate has too many entries (e.g., is too large or too dense), then it may be discarded, and throw it away and the process moves on to the next sequence. Otherwise, the newly built gate may be stored and used to replace the sub-string in the circuit.

What is claimed is:

1. A method for quantum gate optimization, the method comprising:
   reviewing a quantum circuit for sequences of one-wire gates;
   for one or more sequences of one-wire gates, replacing the one-wire gates of the sequence of one-wire gates with a respective replacement one-wire gate;
   reviewing the quantum circuit for sequences of logical two-wire gates, wherein at least one sequence of logical two-wire gates includes at least two one-wire gates on different wires, at least two two-wire gates on at least one common wire, or a combination of gates that spans two wires;
   for one or more sequences of logical two-wire gates, replacing the logical two-wire gates of the sequence of logical two-wire gates with a respective replacement two-wire gate; and
   storing one or more replacement one-wire gates and one or more replacement two-wire gates in a memory.

2. The method of claim 1, further comprising:
   encountering an operation that calls for applying one or more of the one-wire gates to a current state vector, wherein one of the replacement one-wire gates corresponds to the one or more one-wire gates; and
   operating on the current state vector with the corresponding replacement one-wire gate.

3. The method of claim 1, wherein the reviewing, the replacing and the storing associated with the one or more sequences of one-wire gates is a first iteration, and the reviewing, the replacing and the storing associated with the one or more sequences of logical two-wire gates is a second iteration.

4. The method of claim 3, wherein at least one sequence of logical two-wire gates includes at least two one-wire gates on different wires.

5. The method of claim 3, wherein at least one sequence of logical two-wire gates includes at least two two-wire gates on at least one common wire.

6. The method of claim 3, wherein at least one sequence of logical two-wire gates includes at least a combination of gates that span two wires.

7. The method of claim 3, further comprising:
   encountering an operation that calls for applying one or more given gates to a current state vector, wherein the one or more given gates comprise one or more of the one-wire gates or one or more of the two-wire gates, and wherein one of the replacement one-wire gates or the replacement two-wire gates corresponds to the one or more given gates; and
   operating on the current state vector with the corresponding replacement one-wire gate or the corresponding replacement two-wire gate.

8. The method of claim 1, further comprising:
   reviewing the quantum circuit for sequences of logical m-wire gates, where m is in integer having a value greater than two;
   for one or more sequences of logical m-wire gates, replacing the logical m-wire gates of the sequence of logical m-wire gates with a respective replacement m-wire gate; and
   storing one or more replacement m-wire gates in the memory.

9. The method of claim 8, further comprising:
   encountering an operation that calls for applying one or more of the m-wire gates to a current state vector, wherein one of the replacement m-wire gates corresponds to the one or more m-wire gates; and
   operating on the current state vector with the corresponding replacement m-wire gate.

10. The method of claim 1, further comprising:
    identifying a set of quantum gates in the quantum circuit spanning common n-wires, where n is an integer greater than zero, wherein each quantum gate of the set of quantum gates corresponds to a matrix of a set of matrices;
    replacing the set of quantum gates with a larger n-wire quantum gate, wherein the larger n-wire quantum gate corresponds to a replacement matrix, wherein the replacement matrix has dimensions that are larger than any matrix of the set of matrices; and
    storing the replacement matrix corresponding to the larger n-wire quantum gate in the memory.

11. The method of claim 10, wherein application of the larger n-wire quantum gate to the state vector requires less computational time and storage space than application of the set of quantum gates to the state vector.

12. The method of claim 10, wherein the larger n-wire quantum gate comprises a pre-multiplied operator.

13. The method of claim 10, wherein the integer n has a value of one.

14. The method of claim 10, further comprising:
    identifying a second set of quantum gates in the quantum circuit spanning common m-wires, where m is an integer greater than the integer n;
    replacing the second set of quantum gates with a larger m-wire quantum gate; and
    storing the larger m-wire quantum gate in the memory.

15. The method of claim 14, wherein the second set of quantum gates includes at least one j-wire gate, where j is an integer greater than or equal to n and less than m.

16. The method of claim 10, further comprising:
    encountering an operation that calls for applying one or more quantum gates of the set of quantum gates spanning common n-wires to the quantum state vector; and
    operating on the quantum state vector with the larger n-wire quantum gate.

17. The method of claim 10, wherein the quantum circuit includes the larger n-wire quantum gate in replacement for the set of quantum gates spanning common n-wires, the method further comprising:

identifying a set of quantum gates in the quantum circuit spanning common m-wires and that includes the larger n-wire quantum gate, where m is an integer greater than the integer n;

replacing the set of quantum gates spanning common m-wires with a larger m-wire quantum gate; and storing the larger m-wire quantum gate in the memory.

18. The method of claim 10, further comprising:

identifying a set of quantum gates in the quantum circuit spanning common m-wires, where m is an integer greater than zero;

determining a density of a matrix that represents a larger m-wire quantum gate to replace the set of quantum gates spanning common m-wires; and determining whether to replace the set of quantum gates spanning common m-wires with the larger m-wire quantum gate based at least in part on the determined density of the matrix.

19. The method of claim 1, further comprising:

reviewing the quantum circuit for sequences of two-wire gates, wherein the quantum circuit includes at least one replacement one-wire gate;

for one or more sequences of two-wire gates, replacing the corresponding two-wire gates of the sequence of two-wire gates with a respective replacement two-wire gate, and wherein the corresponding two-wire gates of the sequence of two-wire gates includes at least one replacement one-wire gate; and storing one or more replacement two-wire gate in the memory.

* * * * *